(12) United States Patent
Tanaya

(10) Patent No.: US 7,521,846 B2
(45) Date of Patent: Apr. 21, 2009

(54) PIEZOELECTRIC RESONATOR ELEMENT AND PIEZOELECTRIC DEVICE

(75) Inventor: Hideo Tanaya, Suwa (JP)

(73) Assignee: Seiko Epson Corporation (JP)

( * ) Notice: Subject to any disclaimer, the term of this patent is extended or adjusted under 35 U.S.C. 154(b) by 101 days.

(21) Appl. No.: 11/252,317

(22) Filed: Oct. 17, 2005

(65) Prior Publication Data

US 2006/0082261 A1 Apr. 20, 2006

(30) Foreign Application Priority Data

Oct. 20, 2004 (JP) ............................. 2004-305621
Apr. 27, 2005 (JP) ............................. 2005-129906

(51) Int. Cl.
*H03H 9/21* (2006.01)

(52) U.S. Cl. ...................... 310/370; 310/368; 331/156

(58) Field of Classification Search ................ 310/370, 310/368; 333/200

See application file for complete search history.

(56) References Cited

U.S. PATENT DOCUMENTS

| | | | |
|---|---|---|---|
| 4,191,906 A | 3/1980 | Kogure | |
| 5,218,260 A * | 6/1993 | Kawashima | 310/361 |
| 5,824,900 A * | 10/1998 | Konno et al. | 73/504.16 |
| 6,894,428 B2 | 5/2005 | Tanaya et al. | |
| 6,927,530 B2 | 8/2005 | Tanaya et al. | |
| 7,015,631 B2 | 3/2006 | Hirasawa et al. | |
| 7,368,861 B2 * | 5/2008 | Tanaya | 310/370 |
| 2002/0161368 A1 * | 10/2002 | Foley et al. | 606/61 |
| 2004/0085163 A1 * | 5/2004 | Kikushima | 333/200 |
| 2004/0245894 A1 * | 12/2004 | Tanaya et al. | 310/348 |
| 2004/0263027 A1 | 12/2004 | Kawashima | |
| 2005/0140252 A1 * | 6/2005 | Miyata et al. | 310/370 |

FOREIGN PATENT DOCUMENTS

| | | |
|---|---|---|
| JP | 51-140065 | 5/1975 |
| JP | 51-15388 | 2/1976 |
| JP | 54-003487 | 1/1979 |
| JP | 56-085921 | 7/1981 |
| JP | 56-094813 | 7/1981 |
| JP | 56085921 * | 7/1981 |
| JP | 57-185717 | 11/1982 |
| JP | 58-105612 | 6/1983 |
| JP | 01-311712 | 12/1989 |
| JP | 04-090613 | 3/1992 |
| JP | 10-256868 | 9/1998 |

(Continued)

OTHER PUBLICATIONS

Communication from European Patent Office regarding counterpart application.

*Primary Examiner*—Thomas M Dougherty
*Assistant Examiner*—Bryan P Gordon
(74) *Attorney, Agent, or Firm*—Harness, Dickey & Pierce, P.L.C.

(57) ABSTRACT

A piezoelectric resonator element including: a base formed of a piezoelectric material and having a given length; a plurality of vibration arms extending from one part of the base; and a supporting arm extending from another part of the base spaced apart from the one part of the base by the given length in a width direction, the supporting arm extending in a common direction with the vibration arms outboard the vibration arms.

15 Claims, 11 Drawing Sheets

FIRST EMBODIMENT

FOREIGN PATENT DOCUMENTS

| | | | |
|---|---|---|---|
| JP | 2002-261575 | | 9/2002 |
| JP | 2003-069375 | | 3/2003 |
| JP | 2004-215039 | * | 7/2004 |
| JP | 2004-254238 | | 9/2004 |
| JP | 2004-357178 | | 12/2004 |
| JP | 2005-039767 | | 2/2005 |
| JP | 2005-102138 | | 4/2005 |
| JP | 3951058 | | 5/2007 |
| JP | 3978783 | | 7/2007 |

* cited by examiner

FOURTH EMBODIMENT

SEVENTH EMBODIMENT

PIEZOELECTRIC RESONATOR ELEMENT AND PIEZOELECTRIC DEVICE

RELATED APPLICATIONS

This application claims priority to Japanese Patent Application No. 2004-305621 filed Oct. 20, 2004 and 2005-129906 filed Apr. 27, 2005 which are hereby expressly incorporated by reference in their entirety.

BACKGROUND

1. Technical Field

The present invention relates to an improvement on a piezoelectric resonator element and a piezoelectric device including the piezoelectric resonator in its package or case.

2. Related Art

Piezoelectric devices, including a piezoelectric resonator, a piezoelectric oscillator and the like, have been widely used for small information equipment, such as hard disc drives (HDDs), mobile computers, and integrated circuit (IC) cards, and for mobile communications equipment such as mobile phones, car-phones, and paging systems, and piezoelectric gyro sensors, etc.

FIG. 17 is a schematic plan view illustrating an example of a piezoelectric resonator element conventionally used in the piezoelectric devices.

In FIG. 17, a piezoelectric resonator element 1, whose shape shown in the figure is formed by etching a piezoelectric material such as quartz or the like, is provided with a base 2, which is mounted to a package (not shown) or the like, and has a rectangular shape, and a pair of vibration arms 3 and 4, which extend from the base 2 in the vertical direction in FIG. 17. Long grooves 3a and 4a are formed on the main surfaces (front and back surface) of the vibration arms, and necessary driving electrodes are formed.

In the piezoelectric resonator element 1, when a driving voltage is applied via a driving electrode, the vibration arms 3 and 4 perform a flexural vibration so that their distal parts move closer and then spread apart, resulting in an output signal having a given frequency.

Here, the piezoelectric resonator element 1, in which lead-out electrodes are formed at the positions indicated at numerals 5 and 6 on the base 2, is fixed to a base substrate such as a package or the like with adhesives 7 and 8 applied on the lead-out electrodes.

After fixing and supporting the piezoelectric resonator element 1 with the adhesive, cut parts 9 are formed in the base 2 so that the flexural vibration of the vibration arms is prevented from being hindered by remaining stress caused by the differences in the linear expansion coefficient between the material of the package or the like, and the material of the piezoelectric resonator element.

In the piezoelectric resonator element 1, as a result of miniaturization, the width W1 of each of the vibration arms 3 and 4 is approximately 100 μm, the distance MW1 between them is approximately 100 μm, and the width BW1 of the base 2 is approximately 500 μm. These parts are miniaturized, so that the length BL1 of the base is accordingly shortened. As a result, the piezoelectric resonator element 1 is miniaturized.

See JP-A-2002-261575 for an example of this related art.

However, the piezoelectric resonator element 1, which is miniaturized, has the following problem in its temperature characteristics.

FIGS. 18 and 19 are graphs illustrating the temperature characteristics of the piezoelectric resonator element 1. FIG. 18 shows a temperature-frequency characteristic. FIG. 19 shows a temperature-crystal impedance (CI) value characteristic.

As shown in the figures, the temperature-frequency characteristic shown in FIG. 18 shows no problem. However, the temperature-CI value characteristic shown in FIG. 19 has a problem in that it is highly unstable.

It can be considered that the deterioration of the temperature-CI characteristic occurs due to the change of the stress condition at the positions of the base 2 in the piezoelectric resonator element 1, which are bonded with the adhesives 7 and 8, by temperature change. Similar influences can occur due to the change of the stress condition at the positions of the base 2, which are bonded with the adhesives 7 and 8, when they are affected by drop shock or the like.

SUMMARY

An advantage of the invention is to provide a piezoelectric resonator element and a piezoelectric oscillator that have a good temperature characteristic for miniaturization.

The above advantage is achieved in a first aspect of the invention with a piezoelectric resonator element that is provided with a base that is formed of a piezoelectric material and has a given length, and a plurality of vibration arms which extend from one part of the base, and further, a supporting arm that extends from another part of the base spaced apart from the one part by the given length in a width direction, and the supporting arm extending in the same direction as the vibration arms outboard the vibration arms.

According to the structure of the first aspect of the invention, the vibration arms that perform flexural vibration extend from one part of the base, while the supporting arm extends from another part of the base having the given length.

Because of the structure, after the supporting arm is bonded to a base substrate such as a package by adhesive bonding or the like, a stress change, which is produced at the bonding position due to the change of surrounding temperature or drop shock or the like, hardly affects the vibration arms from the bonding position of the supporting arm through the other part of the base, and further, through the distance of the given length of the base. As a result, particularly, the temperature characteristic is improved.

Also, in contrast, vibration leakage from the vibration arms that perform flexural vibration is hardly propagated to the supporting arm, since the vibration leakage reaches the supporting arm spaced apart from the base by the given length of the base. Namely, if the length of the base is extremely short, a situation that is difficult to control may occur since a leaked component of the flexural vibration spreads over the supporting arm. However, in the invention, such a situation is thoroughly avoided.

In addition to the advantageous effects, since the supporting arm extends from the other part of the base in the width direction, and extends in the same direction as the vibration arm outboard the vibration arms, the size of the entire structure can be made compact.

In the structure of the first aspect of the invention, a cut part formed by reducing (e.g., shrinking) the width of the piezoelectric material in the width direction is disposed at a position of the base which is closer to the vibration arm than the connecting part at which the supporting arm is integrally connected to the base.

According to the structure, the vibration leakage caused by the flexural vibration of the vibration arms is suppressed from propagating to the bonding part of the supporting arm through the base. As a result, the CI value can be prevented from increasing.

In the structure of the first aspect of the invention, the length of the supporting arm is set so that the top of the supporting arm is closer to the base than the tops of the vibration arms.

According to the structure, the supporting arm, which has the structure in which the top of the supporting arm is closer to the base than the tops of the vibration arms in addition to the supporting arm extending in the same direction as the vibration arms, allows the size of the entire assembly to be made compact.

In the structure of the first aspect of the invention, the supporting arm is provided with a low stiffness structure at a position closer to the base than the bonding position at which the supporting arm is bonded to the base substrate.

According to the structure, even if the vibration leakage caused by the flexural vibration of the vibration arms slightly reaches the supporting arm, the likelihood of it reaching the bonding part can be reduced as much as possible.

In the structure of the first aspect of the invention, the low stiffness structure is a reduced width part formed halfway along the supporting arm.

According to the structure, the low stiffness structure that is the reduced width part formed halfway along the supporting arm can easily be formed when the outer shape of the piezoelectric resonator element is formed.

In the structure of the first aspect of the invention, the low stiffness structure is a cut part formed halfway along the supporting arm.

According to the structure, the low stiffness structure that is the cut part formed halfway along the supporting arm can easily be formed when the outer shape of the piezoelectric resonator element is formed.

In addition, the above advantage is achieved in a second aspect of the invention with a piezoelectric device in which a piezoelectric resonator element is housed in a package or a case. The piezoelectric device is provided with a base that is formed of a piezoelectric material and has a given length, and a plurality of vibration arms which extend from one part of the base, and further, a supporting arm that extends from another part of the base spaced apart from the one part of the base by the given length in a width direction, and extends in the same direction as the vibration arms outboard the vibration arms.

According to the second aspect of the invention, a piezoelectric device can be realized that is small and compact, and with a good temperature characteristic, by the same principle as that of the first aspect of the invention.

BRIEF DESCRIPTION OF THE DRAWINGS

The invention will be described with reference to the accompanying drawings, wherein like numbers refer to like elements.

DESCRIPTION OF THE EMBODIMENTS

Figure 1:
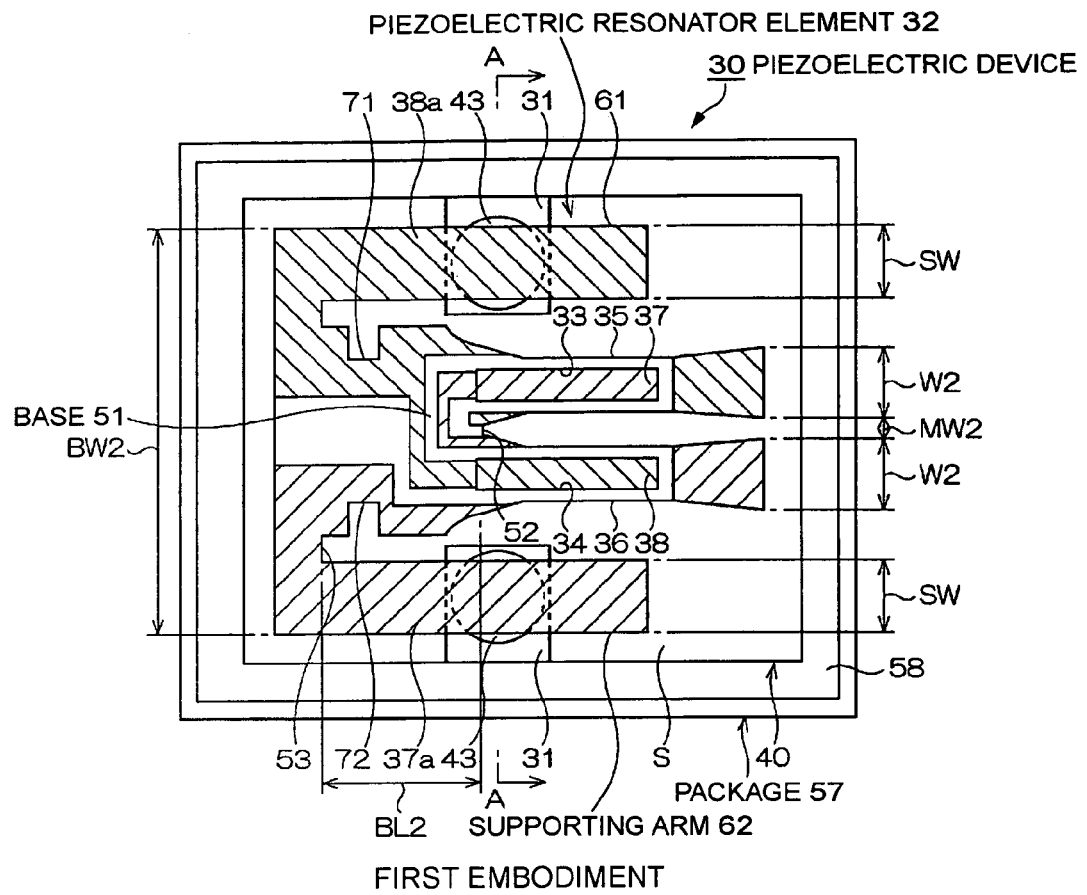
FIG. 1 is a schematic plan view illustrating a piezoelectric device according to a first embodiment of the invention.
Figure 2:
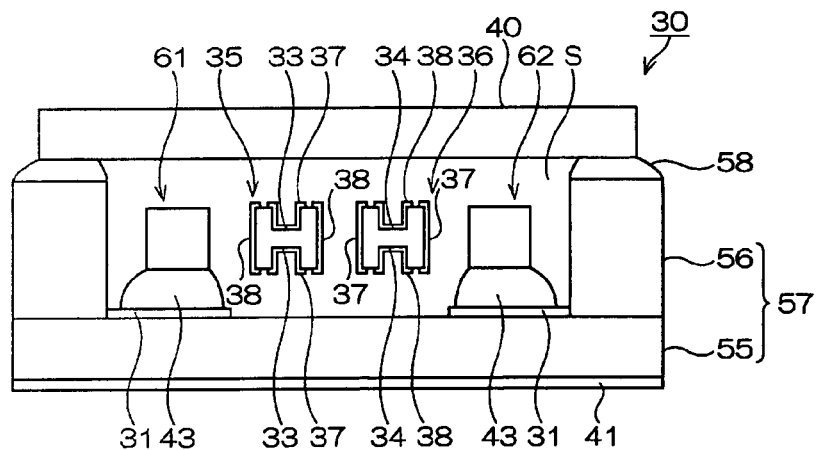
FIG. 2 is a sectional-view along line A-A of FIG. 1.

FIGS. 1 and 2 show a piezoelectric device according to a first embodiment of the invention. FIG. 1 is a schematic plan view thereof and FIG. 2 is a schematic sectional-view taken along the A-A line of FIG. 1.

Referring to the drawings, a piezoelectric device 30 includes a piezoelectric resonator. The piezoelectric device 30 houses a piezoelectric resonator element 32 in a package 57 serving as the base substrate.

The package 57 is formed, for example, in a rectangular box shape as shown in FIGS. 1 and 2. Specifically, the package 57 is formed by laminating a substrate 55 as a first substrate and a substrate 56 as a second substrate. For example, it is formed as follows: a ceramic green sheet made of aluminum oxide is formed as an insulation material; and the sheet is fired to be formed in the shape shown in the figures.

The package 57 includes the inner space S formed by removing the material inside the substrate 56 serving as the second substrate as shown in FIG. 2. The inner space S is a space for housing the piezoelectric resonator element 32. The piezoelectric resonator element 32 is placed and bonded on electrode parts 31 formed on the substrate 55 serving as the first substrate at select positions of supporting arms 61 and 62 with conductive adhesives 43. On the selected positions, a lead-out electrode, which will be described later, is formed.

Accordingly, after fixing and supporting the piezoelectric resonator element 32 with the conductive adhesive 43, a remaining stress is present in a base 51. The remaining stress is caused by the difference in the linear expansion coefficient between the materials of the piezoelectric resonator element 32 and the package 57, and the like.

Here, the electrode parts 31 are connected to a mounting terminal 41 on the backside of the package via a conductive through hole. The package 57 is hermetically sealed by bonding a lid 40, which is made of transparent glass, with a sealing member 58 after housing the piezoelectric resonator element 32. As a result, the frequency can be adjusted by trimming the electrode, or the like of the piezoelectric resonator element 32 with an irradiated laser beam from outside the device after sealing the lid 40.

The piezoelectric resonator element 32 is made of quartz, for example. Instead of quartz, lithium tantalate, lithium niobate or other piezoelectric materials can be used. The piezoelectric resonator element 32 is provided with the base 51 and a pair of vibration arms 35 and 36 as shown in FIG. 1. The vibration arms 35 and 36 are divided into two from one part of the base 51 (the right end of the base 51 in FIG. 1) and extend toward the right direction in parallel with each other.

On the front and back surface of the main surface of each of the vibration arms 35 and 36, long grooves 33 and 34, which extend in the longitudinal direction, are preferably formed. As shown in FIGS. 1 and 2, exciting electrodes 37 and 38, which serve as a driving electrode, are disposed in the long grooves.

In the embodiment, the distal part of each of the vibration arms 35 and 36 is gradually widened in the width so as to be slightly tapered, thereby playing a role of a plummet with increased weight. As a result, the vibration arms easily perform flexural vibration.

In addition, the piezoelectric resonator element 32 extends in the width direction of the base 51 to the other part. The other part (the left end of the base 51 in FIG. 1) is spaced apart from the one part of the base 51, at which the vibration arms are formed, by a given distance BL2 (the length of the base). The piezoelectric resonator element 32 is also provided with supporting arms 61 and 62 at positions outboard of the vibration arms 35 and 36 respectively. The supporting arms 61 and 62 extend in the same direction as each of the vibration arms 35 and 36 (the right direction in FIG. 1), and are in parallel with the vibration arms 35 and 36.

The outer shape of the tuning-fork-like shape of the piezoelectric resonator element 32 and the long groove formed in each of the vibration arms can be precisely formed, for example, by wet etching a material such as a quartz wafer or the like with a hydrofluoric solution or by dry etching.

The exciting electrodes 37 and 38 are correspondingly formed in the long grooves 33 and 34, and the side surfaces of the vibration arms. In each of the vibration arms, the electrode formed in the long groove and the electrode formed on the side surface are paired. Each of the exciting electrodes 37 and 38 extends to each of the supporting arms 61 and 62 as lead-out electrodes 37a and 38a respectively. Accordingly, in a case where the piezoelectric device 30 is mounted to a mounting substrate or the like, a driving voltage from outside is applied to each of the lead-out electrodes 37a and 38a in supporting arms 61 and 62 via each of the electrode parts 31 from the mounting terminal 41, thereby being applied to each of the exciting electrodes 37 and 38.

The driving voltage applied to the exciting electrode in the long grooves 33 and 34 allows electric field efficiency inside the region, in which the long groove of each vibration arm is formed, to be increased at the time of being driven.

Preferably, the base 51 is provided with a concave part, which is formed by partially reducing the dimension in the width direction of the base 51, or cut parts 71 and 72, at both of its side edges. Both side edges are sufficiently spaced apart from the end part, which is adjacent to the vibration arms, of the base 51. The depth of each cut part 71 and 72 is preferably set by reducing the width so that each bottom nearly coincides with the outer side edge of each of the vibration arms 35 and 36 respectively adjacent to the cuts parts 71 and 72.

Accordingly, a vibration leakage is suppressed from leaking (transferred) to the base 51 and propagating to the supporting arms 61 and 62 when the vibration arms 35 and 36 perform the flexural vibration. As a result, the CI value can be suppressed to a low value.

In the embodiment, the other end part 53, from which the supporting arms 61 and 62 extend, of the base 51 is located so as to keep the distance BL2 sufficiently spaced apart from a footing part 52 of the vibration arms 35 and 36.

The dimension of the distance BL2 preferably exceeds the arm width dimension W2 of the vibration arms 35 and 36.

Namely, when the vibration arms 35 and 36 of the tuning fork type resonator element perform the flexural vibration, the area in which the vibration leakage propagates toward the base 51 has a relative correlation with the arm width dimension W2 of the vibration arms 35 and 36. The inventor focuses attention to this point, having knowledge that the position serving as the base end of the supporting arms 61 and 62 should be disposed at the proper position.

Therefore, in the embodiment, a structure can be achieved in which the vibration leakage from the vibration arms 35 and 36 is more surely suppressed from propagating to areas adjacent the supporting arms 61 and 62 in the following manner: the position of the other end part 53, which serves as the base end of the supporting arms 61 and 62, is chosen so that the distance from the footing part 52 of the vibration arms to the other end part 53 exceeds the dimension corresponding to the size of the arm width dimension W2 of the vibration arms. Therefore, in order to obtain advantageous effects of the supporting arms, which will be described later, while suppressing the CI value, it is preferable that the position of the other end part 53 is spaced apart from the footing part 52 (i.e. the one end part of the base 51) of the vibration arms 35 and 36 by the distance BL2.

For the same reason, it is preferable that the positions at which the cut parts 71 and 72 are formed are spaced apart from the footing part 52 of the vibration arms 35 and 36 by a distance that exceeds the dimension of the arm width W2 of the vibration arms 35 and 36. Therefore, the cut parts 71 and 72 are formed at the positions, which include a part where the supporting arms 61 and 62 are integrally connected to the base 51, and are adjacent the vibrating arms.

Since the supporting arms 61 and 62 are uninvolved in the vibration, no specific conditions are required for their arm widths SW. However, it is preferable that the width SW be larger than that of each vibration arm in order to assure a proper supporting structure.

Consequently, in the embodiment, the width BW2 of the base 51 can be made to be 500 μm by the following: the vibration arms having the arm width W2 of approximately 50 μm; the supporting arms 61 and 62 having the width SW of approximately 100 μm; and the distance MW2 between the vibration arms of approximately 80 μm. The piezoelectric resonator element 32 has the width BW2, which is nearly the same as the width of the piezoelectric resonator element 1 in FIG. 17, and shorter in length. As a result, the piezoelectric resonator element 32 can be fully housed in a package having the same size as conventional packages. The embodiment can obtain the following advantageous effects while achieving such miniaturization.

In the piezoelectric resonator element 32 in FIG. 1, since the supporting arms 61 and 62 are bonded to the package 57 with the conductive adhesive 43, the stress change, which is produced at the bonding position due to the change of surrounding temperature or drop shock or the like, hardly affects the vibration arms 35 and 36 due to the crooked distance from the bonding position of the supporting arms 61 and 62 to the other end part 53 of the base 51, and further the distance of the length of the base 51, which is more than the distance BL2. As a result, particularly, the assembly exhibits good temperature characteristics.

In contrast, the vibration leakage from the vibration arms 35 and 36, which perform the flexural vibration, is hardly propagated to the supporting arms 61 and 62, since the vibration leakage reaches the supporting arms 61 and 62 through the base 51 including the given length that is more than the distance BL2.

If the length of the base 51 is extremely short, a situation that is difficult to control may occur since a leaked component of the flexural vibration spreads over the supporting arms 61 and 62. However, in the embodiment, such situation is thoroughly avoided.

In addition to the advantageous effects, since the supporting arms 61 and 62 extend from the other end part 53 of the base 51 in the width direction, and extend in the same direction as the vibration arms 35 and 36 outboard the vibration arms 35 and 36, the size of the entire assembly can be made compact.

Further, in the embodiment, the distal ends of the supporting arms 61 and 62 are formed so as to be closer to the base 51 than the distal ends of the vibration arms 35 and 36 as shown in FIG. 1. On this point, the size of the piezoelectric resonator element 32 also can be made compact.

Figure 17:
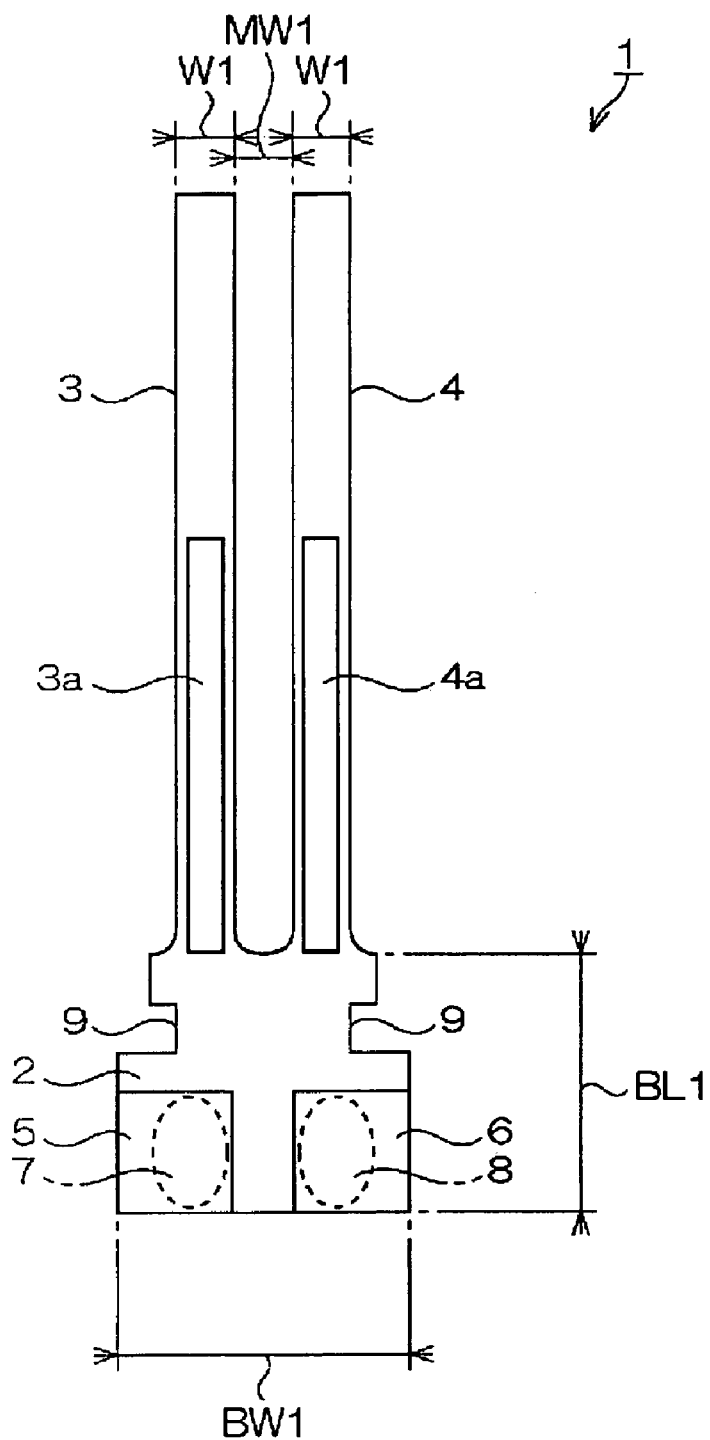
FIG. 17 is a schematic plan view of a related art piezoelectric resonator element.
Figure 18:
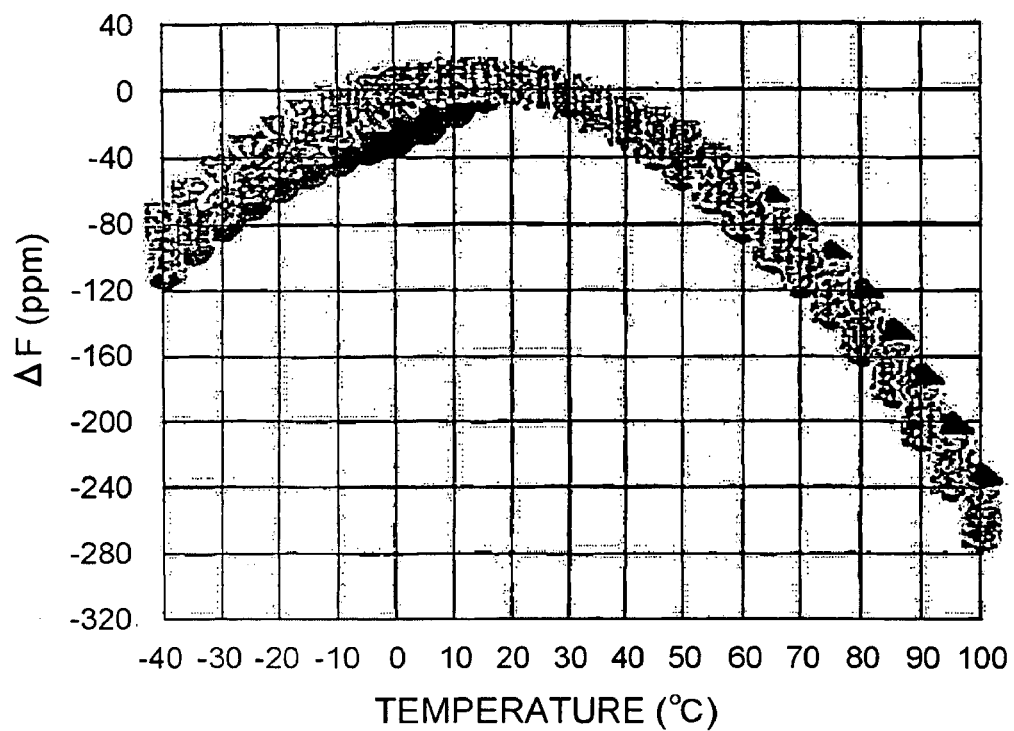
FIG. 18 is a graph illustrating a temperature-frequency characteristic of the piezoelectric resonator element used in the piezoelectric device in FIG. 17.

Moreover, as compared with the structure of FIG. 17, the following can easily be understood. In FIG. 17, the conductive adhesives 7 and 8 are applied to the lead-out electrodes 5 and 6, both of which are closely located. Because of this structure, the bonding process should be carried out by applying the adhesive to extremely narrow areas (of the package) so that they do not contact each other (for avoiding a short), and by paying attention, even after bonding, not to flow out the adhesive to cause a short before curing it. As a result, the process is difficult.

In contrast, in the piezoelectric resonator element 32 in FIG. 1, the conductive adhesives 43 are merely applied to the electrode parts 31 that are respectively located at an approximately intermediate position of the supporting arms 61 and 62, both of which are spaced apart across the width direction of the package 57. This causes few difficulties as above described, and also no worries of short circuiting.

Figure 3:
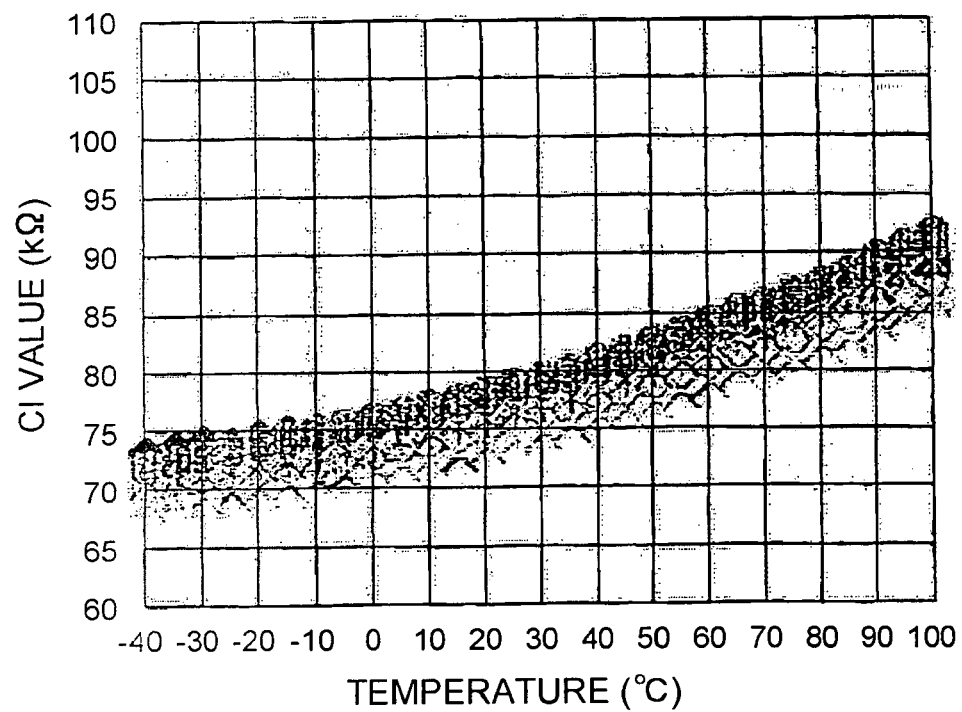
FIG. 3 is a graph illustrating a temperature-CI value characteristic of a piezoelectric resonator element used in the piezoelectric device in FIG. 1.
Figure 4:
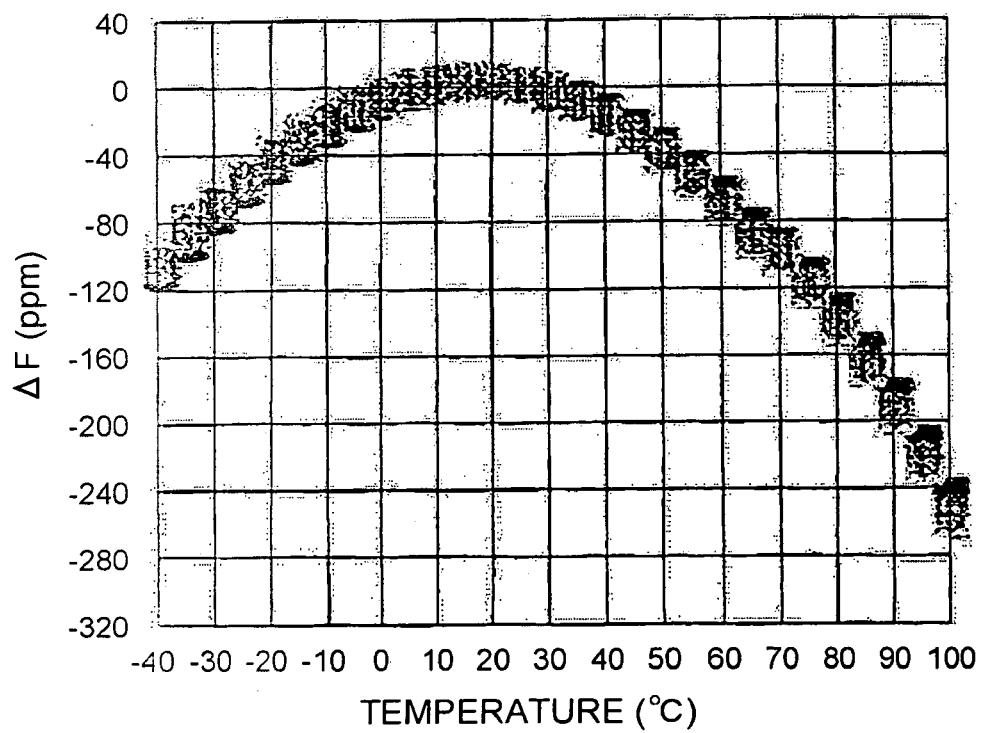
FIG. 4 is a graph illustrating a temperature-frequency characteristic of the piezoelectric resonator element used in the piezoelectric device in FIG. 1.

FIGS. 3 and 4 are graphs illustrating the temperature characteristics of the piezoelectric resonator element 32 of the embodiment. FIG. 3 shows a temperature-CI value characteristic. FIG. 4 shows a temperature-frequency characteristic.

Figure 19:
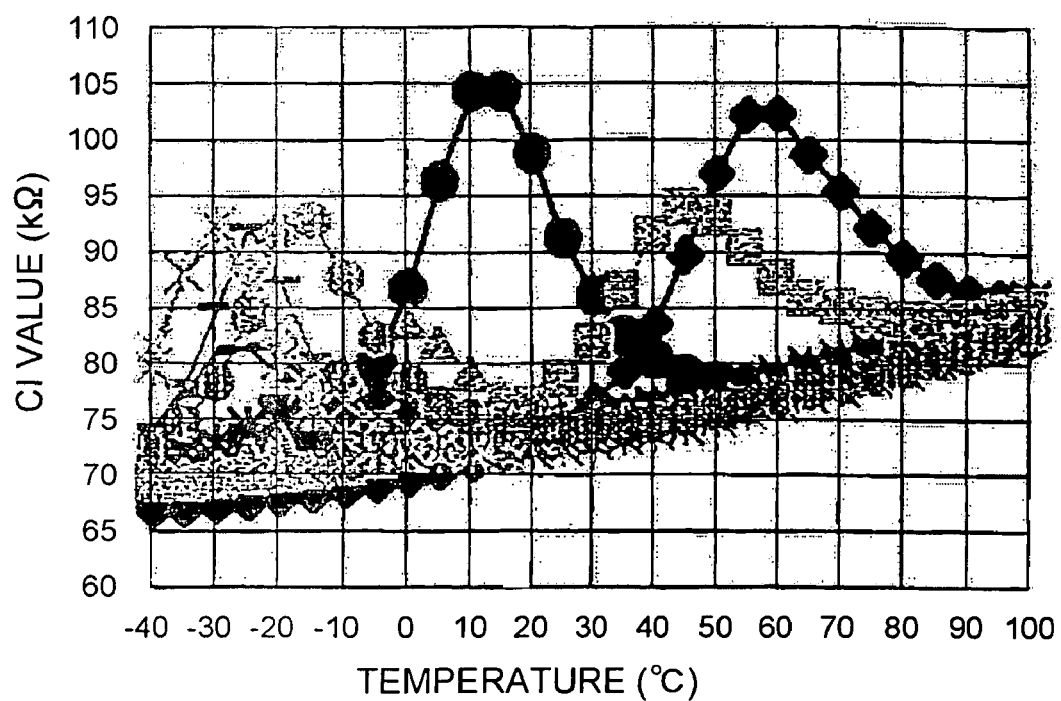
FIG. 19 is a graph illustrating a temperature-CI value characteristic of the piezoelectric resonator element used in a piezoelectric device in FIG. 17.

As shown in FIGS. 3 and 4, the temperature-frequency characteristic in FIG. 4 shows no problem. In addition and unlike the conventional embodiment, the temperature-CI value characteristic in FIG. 3 is extremely good as can easily be understood by comparing it with FIG. 19.

SECOND EMBODIMENT AND THIRD EMBODIMENT

Figure 5:
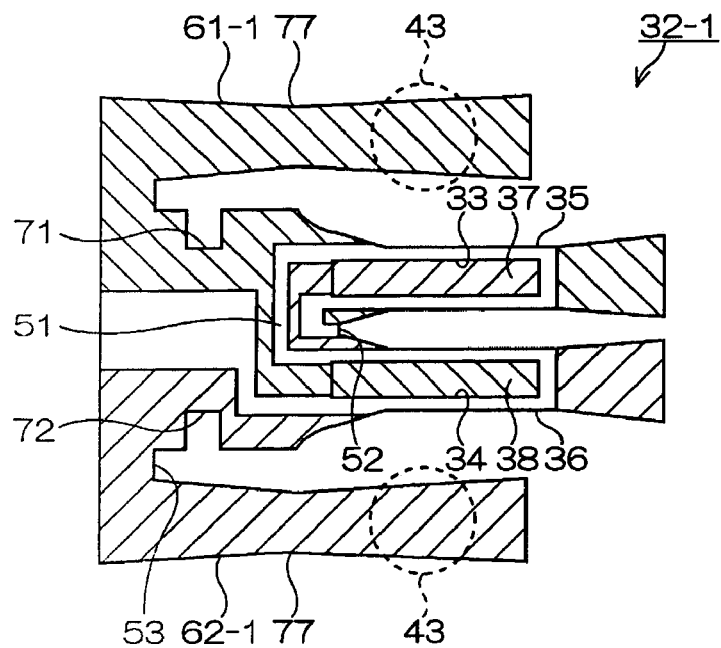
FIG. 5 is a schematic plan view illustrating a second embodiment of the piezoelectric resonator element in FIG. 1.
Figure 6:
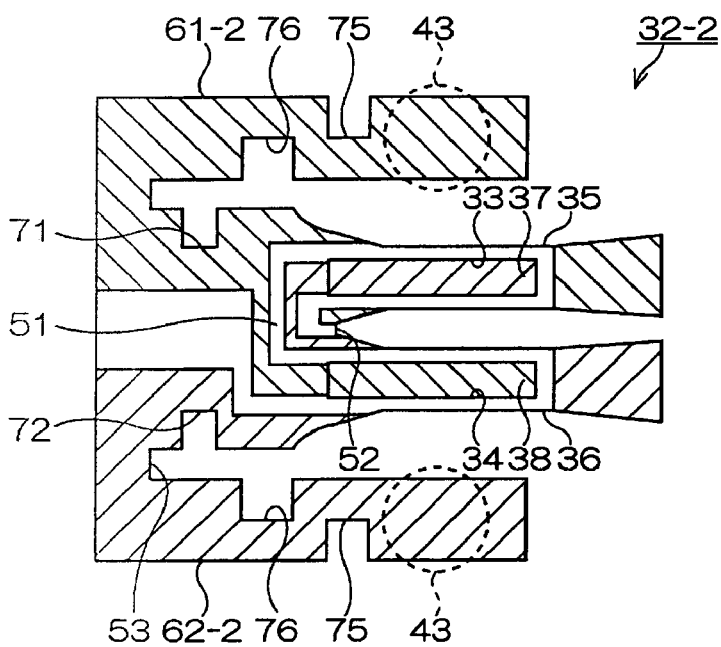
FIG. 6 is a schematic plan view illustrating a third embodiment of the piezoelectric resonator element in FIG. 1.

FIGS. 5 and 6 respectively show the piezoelectric resonator element according to a second embodiment and a third embodiment of the invention. They show examples in which a low stiffness structure is employed to a part of the supporting arm. The parts shown in these drawings that are common to the piezoelectric resonator element 32 described in FIGS. 1 and 2 are given the same reference numerals, and a duplicate description thereof will be omitted here. Below, differences will be mainly described.

In these embodiments, the low stiffness structure is disposed at a position between the base 51 and the conductive adhesive 43, which is applied at the bonding position. As a result, even if the vibration leakage from the flexural vibration of the vibration arms reaches the supporting arms, the likelihood of it reaching the bonding position can be reduced as much as possible.

In the piezoelectric resonator element 32-1 in FIG. 5, the low stiffness structure is a reduced width part 77 formed essentially halfway along each of supporting arms 61-1 and 62-1.

Namely, in each of the supporting arms 61-1 and 61-2, the arm width is gradually reduced in the vicinity of the intermediate part of its longitudinal direction. The vicinity of the intermediate part is the reduced width part having the narrowest width. Therefore, the reduced width parts 77 are parts having the lowest stiffness in the supporting arms. The propagated strain tends to concentrate here. As a result, this structure propagates little vibration leakage to the positions where the conductive adhesives 43 are applied. In addition, the reduced width parts 77 can easily be formed by etching when forming the outer shape of the piezoelectric resonator element 32-1.

In the piezoelectric resonator element 32-1 in FIG. 6, the low stiffness structure is cut parts 75 and 76 formed essentially halfway along each of supporting arms 61-2 and 62-2. Since the supporting arms 61-2 and 62-2 have the same structure, only the supporting arm 61-2 will be explained. The cut part 75 is the cut part that is cut into the width direction from the outboard side of the supporting arm 61-2. The cut part 76 is the cut part that is cut into the width direction from the inboard side of the supporting arm 61-2.

In order to more firmly prevent the flexural vibration of the vibration arms 35 and 36 from being leaked, it is better to provide both the cut parts 75 and 76. However, one cut part can also achieve the effect of reducing the vibration leakage. Forming both the cut parts 75 and 76 lessens the stiffness of the supporting arm 61-2. However, if either one is formed, no major strength reduction occurs.

Namely, in the case where the function for preventing the vibration from being leaked is emphasized, it is better to provide both the cut parts 75 and 76. In the case where the strength of the supporting arm 61-2 is emphasized, it is better to provide only one of them. In addition, the cut parts 75 and 76 can easily be formed by etching when forming the outer shape of the piezoelectric resonator element 32-2.

FOURTH EMBODIMENT

Figure 7:
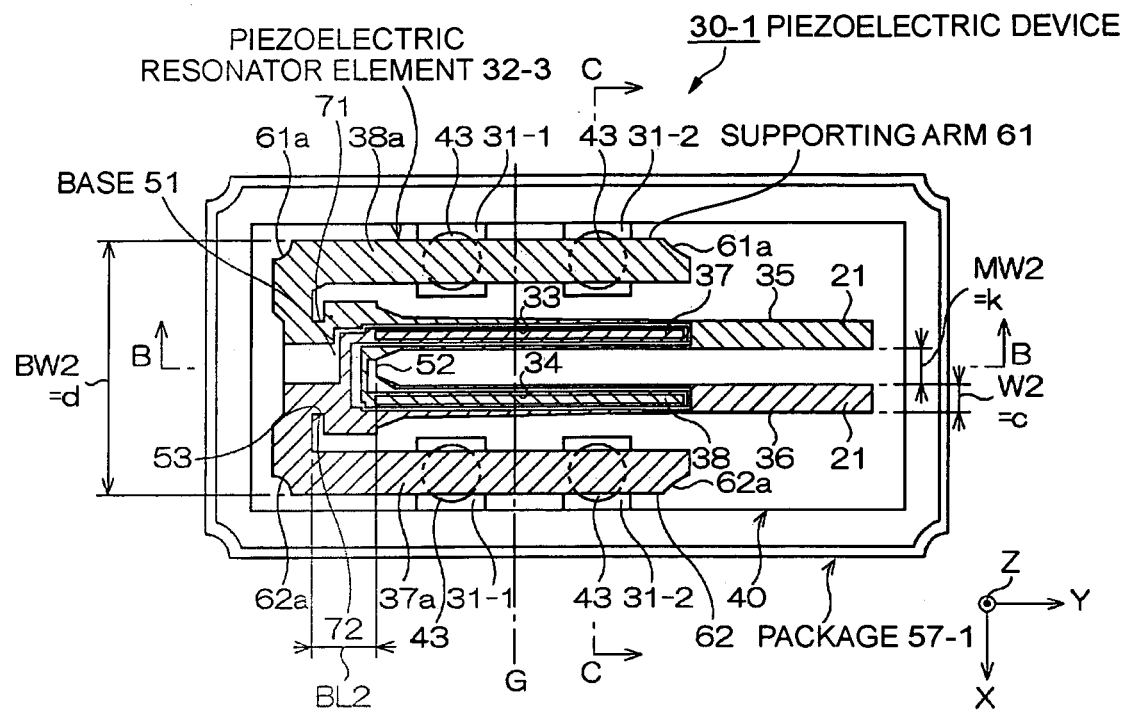
FIG. 7 is a schematic plan view illustrating a fourth embodiment of a piezoelectric device.
Figure 8:
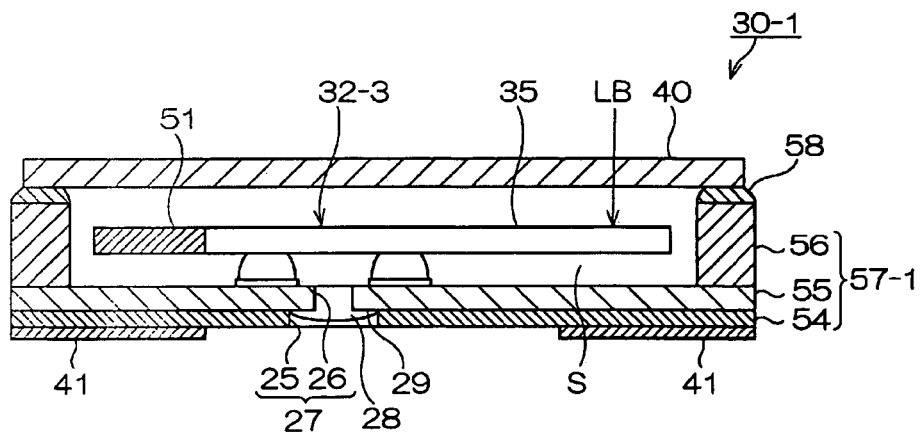
FIG. 8 is a sectional-view along line B-B of FIG. 7.
Figure 9:
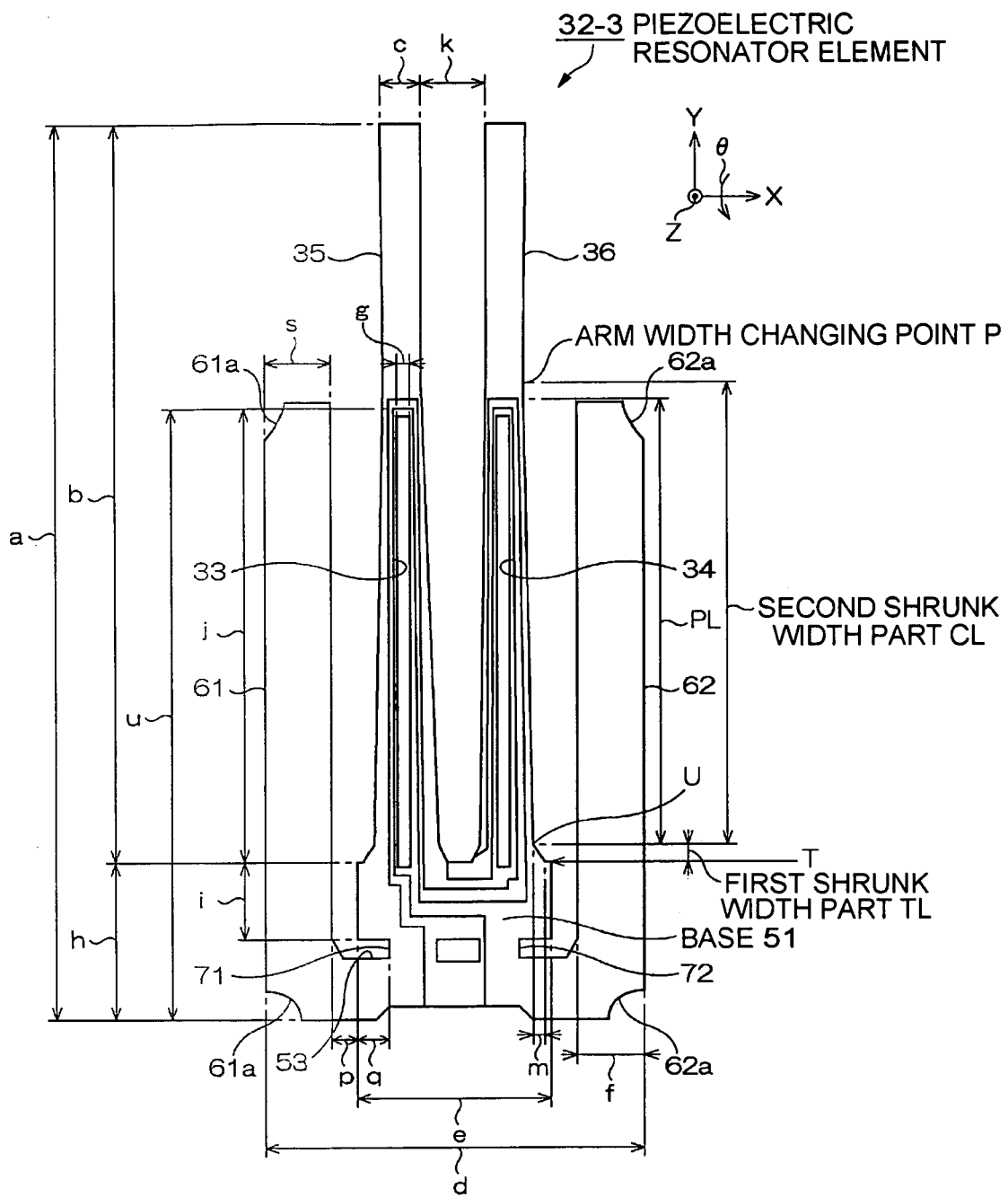
FIG. 9 is a schematic enlarged plan view of the piezoelectric resonator element according to a fourth embodiment.
Figure 10:
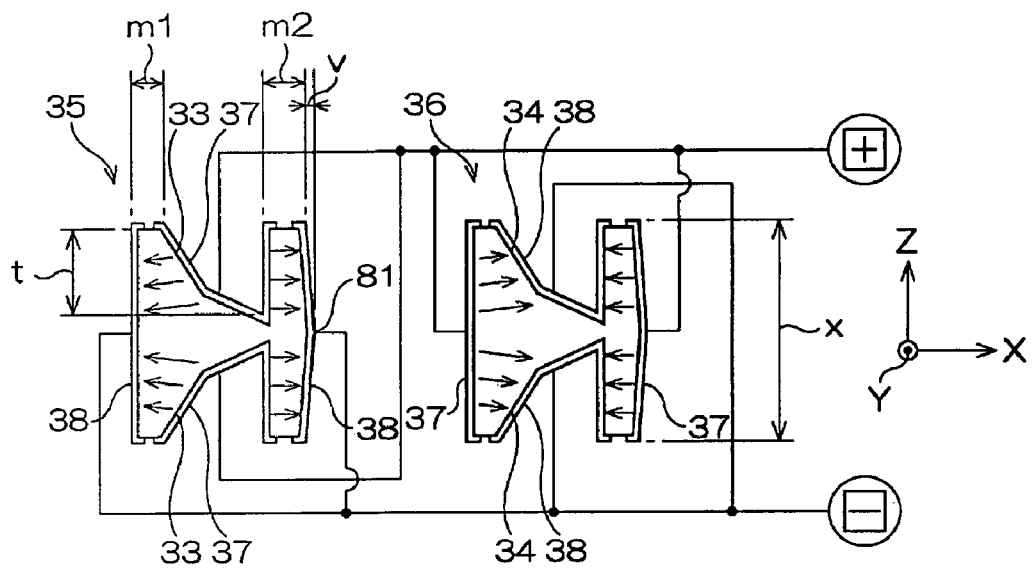
FIG. 10 is a sectional-view along line C-C on the vibration arms in FIG. 7.

FIGS. 7 and 8 show the piezoelectric device according to a fourth embodiment of the invention. FIG. 7 is a schematic plan view thereof, and FIG. 8 is a schematic sectional-view taken along the B-B line in FIG. 7. In addition, FIG. 9 is an enlarged plan view to explain the details of the piezoelectric resonator element 32 in FIG. 7. FIG. 10 is a schematic sectional-view taken along the C-C line on vibration arms in FIG. 7.

In the structure of the piezoelectric device 30-1 shown in FIGS. 9 and 10, since the parts given the same numerals of those of the piezoelectric device 30 described in FIG. 1 are common structures, a duplicate description thereof will be omitted here. Below, differences will be mainly described.

The package 57-1, which is formed, for example, in a rectangular box shape as shown in FIGS. 7 and 8, differs from the package 57 in FIG. 1 in that it is formed by laminating the following three substrates: a substrate 54 as a first substrate, the substrate 55 as a second substrate, and the substrate 56 as a third substrate.

A through hole 27 for degassing during manufacturing processes is formed at the bottom of the package 57-1. The through hole 27 includes a first hole 25 formed to the substrate 54 serving as the first substrate, and a second hole 26 formed to the substrate 55 serving as the second substrate. The second hole 26 has an outer diameter smaller than the first hole 25, and communicates with the first hole 25.

The through hole 27 is sealed by filling a sealing member 28 so as to make the inside of the package 57-1 airtight.

The piezoelectric resonator element 32-3 is placed and bonded on electrode parts 31-1 and 31-2 formed on the substrate 55 serving as the second substrate with conductive adhesives 43 at select positions of supporting arms 61 and 62 of the piezoelectric resonator element 32-3. At the select positions, a lead-out electrode, which will be described later, is formed. Therefore, the bonding strength for bonding the piezoelectric resonator element 32-3 is more excellent than the piezoelectric device 30 in FIG. 1.

Here, since the supporting arms 61 and 62 have the same shape, the supporting arm 61 will be explained referring to FIG. 9. The length dimension u is desired to be within 60 to 80% of the entire length a of the piezoelectric resonator element 32-3 in order to achieve a stable supporting structure.

In addition, a low stiffness part or structure, which is, for example, the cut part or reduced width part such as the structure explained with numerals 75 and 76 in FIG. 6, may be disposed at a part of a position between the bonding position of the supporting arm 61 and the base 51. As a result, a reduction of the CI value or the like can be expected.

Further, the outside corner parts 61a and 62a of the supporting arms 61 and 62 are chamfered in an R-shaped manner, which is convex toward the outside or concave toward the inside, preventing the supporting arms 61 and 62 from being damaged due to cracking, and the like.

The bonding position of the supporting arm can be chosen, for example, regarding the supporting arm 61, to be only one part corresponding to the gravity center G of the length dimension of the piezoelectric resonator element 32-3 as explained in FIG. 7. However, it is preferable that, as shown in the embodiment, the electrode parts 31-1 and 31-2 are chosen to be two points spaced apart from the gravity center located therebetween by the same distance so as to be bonded and to further strengthen the bonding structure.

In a case where the bonding is carried out at one point regarding one supporting arm, it is preferable for achieving a sufficient bonding strength that the length of a region for applying the adhesive is maintained so as to be 25% or more of the entire length a of the piezoelectric resonator element 32-3.

In a case where two bonding points are provided as shown in the embodiment, it is preferable for achieving a sufficient bonding strength that the distance between the bonding positions is 25% or more of the entire length a of the piezoelectric resonator element 32-3.

Here, at least one set of the electrode parts 31-1 and 31-2 among the electrode parts 31-1 and 31-2 are connected to the mounting terminals 41 on the backside of the package via conductive through holes, or the like. The package 57 is hermetically sealed by bonding a lid 40, which is made of transparent glass, with a sealing member 58 after housing the piezoelectric resonator element 32-3.

A structure may be employed in which the lid 40, which is, for example, a metal plate such as a cover, and not a transparent material, and bonded by a seam sealing.

As shown in FIG. 10, each of the exciting electrodes 37 and 38 of the piezoelectric resonator element 32-3 is connected to an alternating current power supply source with a cross wiring. An alternating voltage serving as a driving voltage is applied to each of the vibration arms 35 and 36 from the power supply source.

Accordingly, the vibration arms 35 and 36 are excited so as to vibrate with a reversed phase from each other. In a fundamental mode, i.e. fundamental wave, the vibration arms 35 and 36 perform a flexural vibration so that their distal parts move closer and then spread apart.

Here, the fundamental wave of the piezoelectric resonator element 32-3 is, for example, as follows: Q value is 12000; capacitance ratio (C0/C1) is 260; CI value is 57 kΩ; and frequency is 32.768 khz (kilo hertz, hereinafter referred to as khz).

Also, the second harmonic wave is, for example, as follows: Q value is 28000; capacitance ratio (C0/C1) is 5100; CI value is 77 kΩ; and frequency is 207 khz.

Next, the preferable detailed structure of the piezoelectric resonator element 32-3 of the embodiment will be explained referring to FIGS. 9 and 10.

Since each of the vibration arms 35 and 36 of the piezoelectric resonator element 32-3 shown in FIG. 9 has the same shape, only the vibration arm 36 will be explained. The vibration arm width is the widest at the base end part T at which each of the vibration arms extends from the base 51. A first reduced width part TL, which drastically reduces the width between the positions of T to U, is formed. The position T is the footing part of the vibration arm 36. The position U is spaced apart from the position T toward the distal part of the vibration arm 36 by a little distance. A second reduced width part, which gradually and continuously decreases the width from the position U to the position P, namely, across the distance CL of the vibration arm. The position U is the end of the first reduced width part TL. The position P is spaced apart from the position U further toward the distal part of the vibration arm 36.

Accordingly, the vibration arm 36 has a high stiffness with the first reduced width part TL provided at the footing part close to the base. The vibration arm 36 also has a stiffness continuously decreased with the second reduced width part CL, which is formed from the point U serving as the end of the first reduced width part to the distal part. The part P is the changing point P at which the width is changed. Further, it is a constricted position of the vibration arm 36. Thus, it also can be expressed as the constricted position P. In the vibration arm 36, the arm width extends from the changing point P to the distal part with the same width, or preferably, with the width gradually and slightly enlarged as shown in the figure.

Here, the longer long grooves 33 and 34 in FIG. 9, increase the electric field efficiency of the material forming the vibration arms 35 and 36. Here, the longer the long grooves, the lower the CI value of the tuning fork type resonator element. For example, at least j/b is up to approximately 0.7, where b is the entire length of vibration arm and j is the length of the long grooves 33 and 34 from the base 51. Therefore, j/b is preferably from 0.5 to 0.7. In the embodiment, the entire length b of the vibration arm 36 is, for example, approximately 1250 μm in FIG. 9.

In addition, when the length of the long groove is adequately elongated to thoroughly suppress the CI value, a next arising problem is the CI value ratio (CI value of harmonic wave/CI value of fundamental wave) of the piezoelectric resonator element 32-3. Namely, if the CI value of a harmonic wave is smaller than the CI value of the fundamental wave since the CI value of the harmonic wave is simultaneously suppressed by reducing the CI value of the fundamental wave, oscillation with the harmonic wave easily occurs.

Accordingly, in addition to elongating the long groove to reduce the CI value, the changing point P is provided more closely to the distal part of the vibration arm. This allows the CI value ratio (CI value of harmonic wave/CI value of fundamental wave) to be more increased while reducing the CI value.

Namely, the stiffness of the bottom part, i.e. in the vicinity of the footing part, of the vibration arm 36 is strengthened by the first reduced width part TL. This strengthened stiffness allows the flexural vibration of the vibration arms to be more stable. As a result, the CI value can be suppressed.

Since the second reduced width part CL is provided, the stiffness of the vibration arm 36 is gradually lowered from its footing part, toward the distal part, to the constricted position P serving as the changing point of the vibration width. From the constricted position P to the distal part, the stiffness of the vibration arm 36 is gradually increased because the long groove 34 is not provided, and the width of the vibration arm is gradually widened.

Accordingly, it can be considered that the node of the vibration in the second harmonic wave can be shifted to the position closer to the distal part of the vibration arm 36. As a result, lowering the CI value of the second harmonic wave cannot be provoked while suppressing the CI value of the fundamental wave even though the CI value is increased by increasing the electric field efficiency of the piezoelectric material with elongated long groove 34. Consequently, the CI value ratio is almost certainly increased by preferably providing the changing point P of the arm width closer to the distal part of the vibration arm from the end part of the long groove as shown in FIG. 9, thereby allowing the oscillation with the harmonic wave to be prevented.

Moreover, according to research by the inventor, j/b, an arm width reduced ratio M, and the CI value ratio corresponding to them are correlated, where b is the entire length of the vibration arm, j is the length of the grooves 33 and 34 from the base 51, M is the ratio of the maximum width and the minimum width of the vibration arm 35, and CI value ratio is the ratio of the CI value of the second harmonic wave and the CI value of the fundamental wave.

In addition, it was confirmed that the oscillation with harmonic wave was able to be prevented by the CI value ratio that became more than one (1) by increasing the arm width reduced ratio M, which is the ratio of the maximum width and the minimum width of the vibration arm 35, so as to be more than 1.06 in a case where j/b is 61.5%.

As a result, a piezoelectric resonator element can be provided that can control the CI value of the fundamental wave at a low value, and does not deteriorate drive characteristics even though it is wholly miniaturized.

Next, a more preferable structure of the piezoelectric resonator element 32-3 will be explained.

The wafer thickness, i.e. the thickness of quartz wafer forming the piezoelectric resonator element, shown in FIG. 10 as the dimension x is preferably from 70 to 130 μm.

The entire length of the piezoelectric resonator element 32-3 shown in FIG. 9 as the dimension a is approximately from 1300 to 1600 μm. It is preferable for miniaturizing the piezoelectric device that the dimension b, which is the entire length of the vibration arm, is from 1100 to 1400 μm, while the entire width d of the piezoelectric resonator element 32-3 is from 400 to 600 μm. Accordingly, in order to miniaturizing the tuning fork part, it is desired for ensuring a supporting effect that the width dimension e of the base 51 is from 200 to 400 μm, while the width f of the supporting arm is from 30 to 100 μm.

The dimension k between the vibration arms 35 and 36 in FIG. 9 is preferably from 50 to 100 μm. If the dimension k is less than 50 μm, it is difficult to sufficiently lessen a fin shaped convex part, which is an irregular shaped part due to an anisotropic etching, in the positive X axis direction in the side of the vibration arm shown in FIG. 10 with numeral 81 when the outer shape of the piezoelectric resonator element 32-3 is formed by wet etching through the quartz wafer, which will be described later. If the dimension x is 100 μm or more, the flexural vibration of vibration arms has a risk of being unstable.

In addition, both dimensions m1 and m2 are from 3 to 15 μm. They are the dimensions between the outer edge of the long groove 33 and the outer edge of the vibration arm in the vibration arm 35 (the same as in the vibration arm 36) in FIG. 10. The electric field efficiency is improved by the dimensions m1 and m2 of 15 μm and below. The dimensions m1 and m2 of 3 μm or more have an advantage to reliably perform a polarization of electrode.

The first reduced width part TL having the width dimension m of 11 μm or more in the vibration arm 36 in FIG. 9 can be expected to show a definite effect on suppressing the Cl value.

In the vibration arm 36 in FIG. 9, it is preferable that the arm width is widened from the changing point P of the arm width to the distal part by approximately from zero (0) to 20 μm with respect to the width of the changing point P of the arm width, which is the position at which the arm width of the vibration arm 36 is the minimum. Widening the width over the width described above has a risk of deteriorating a stability of the flexural vibration, since the distal part of the vibration arm 36 is too heavily weighted.

An irregular shaped part 81 is formed on one side of the outside of the vibration arm 35 (the same as in the vibration arm 36) in FIG. 10. The irregular shaped part 81 has a fin shape and protrudes in the positive X-axis direction. This is formed as etching remains due to the anisotropic etching of quartz when the piezoelectric resonator element is wet etched for forming its outer shape. In order to achieve the stable flexural vibration of the vibration arm 35, it is preferable that the protruded amount v of the irregular shaped part 81 is reduced within 5 μm by performing the etching in the etching solution containing hydrofluoric acid and ammonium fluoride for 9 to 11 hours.

It is preferable that the width dimension of the long groove, which is shown as the dimension g in FIG. 9, is approximately from 60 to 90% with respect to the arm width C of vibration arm in the region, in which the long groove is formed, of the vibration arm. The arm width C varies at the position along the longitudinal direction of the vibration arm since the first and second reduced width parts are formed to the vibration arms 35 and 36. The width g of the long groove is approximately from 60 to 90% with respect to the maximum width of the vibration arm. If the width of the long groove is smaller than this, the electric field efficiency is lowered, resulting in the CI value being increased.

In addition, the entire length h of the base 51 in FIG. 9, which is approximately 30% with respect to the entire length a of the piezoelectric resonator element 32-3 conventionally, can be achieved to be approximately 15 to 25% by employing the cut part, etc., in the embodiment. As a result, the miniaturization is achieved.

Moreover, similar to the embodiment shown in FIG. 1, the concave part or the cut parts 71 and 72 are preferably disposed at both side edges of the base 51. Its depth (the dimension q in FIG. 9) can be, for example, approximately 60 μm.

Further, in the embodiment, the distance (dimension p) between the side of the base 51 and the supporting arm 61 or 62 is from 30 to 100 μm in order to miniaturize the package dimension.

Figure 11:
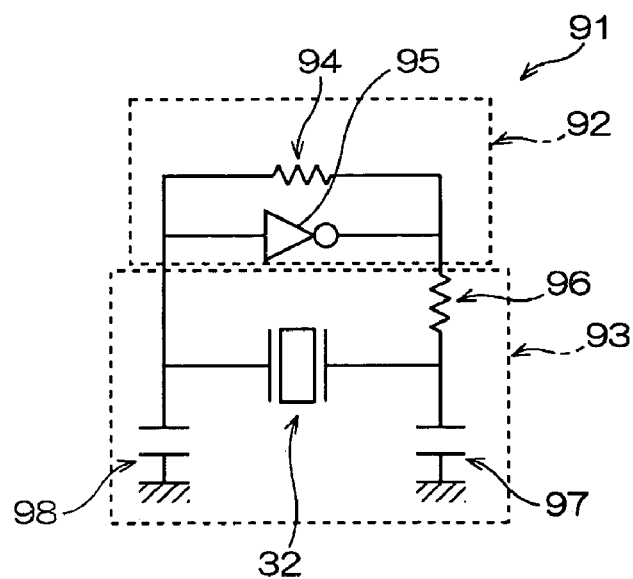
FIG. 11 is a circuit diagram illustrating an oscillation circuit using the piezoelectric resonator element in FIG. 7.

FIG. 11 is a circuit diagram illustrating an example of an oscillation circuit when a piezoelectric oscillator is constructed by using the piezoelectric resonator element 32 of the embodiment.

An oscillation circuit 91 includes an amplifying circuit 92 and a feedback circuit 93.

The amplifying circuit 92 is constructed by including an amplifier 95 and a feedback resistor 94. The feedback circuit 93 is constructed by including a drain resistor 96, capacitors 97 and 98, and the piezoelectric resonator element 32.

In FIG. 11, the feedback resistor 94 is, for example, approximately 10 MΩ (mega ohm). The amplifier 95 can employ a CMOS inverter. The drain resistor 96 is, for example, from 200 to 900 kΩ (kilo ohm). Each of the capacitor 97 (drain capacitance) and the capacitor 97 (gate capacitance) is from 10 to 20 pF (pico farad).

FIFTH EMBODIMENT TO SEVENTH EMBODIMENT

Figure 13:
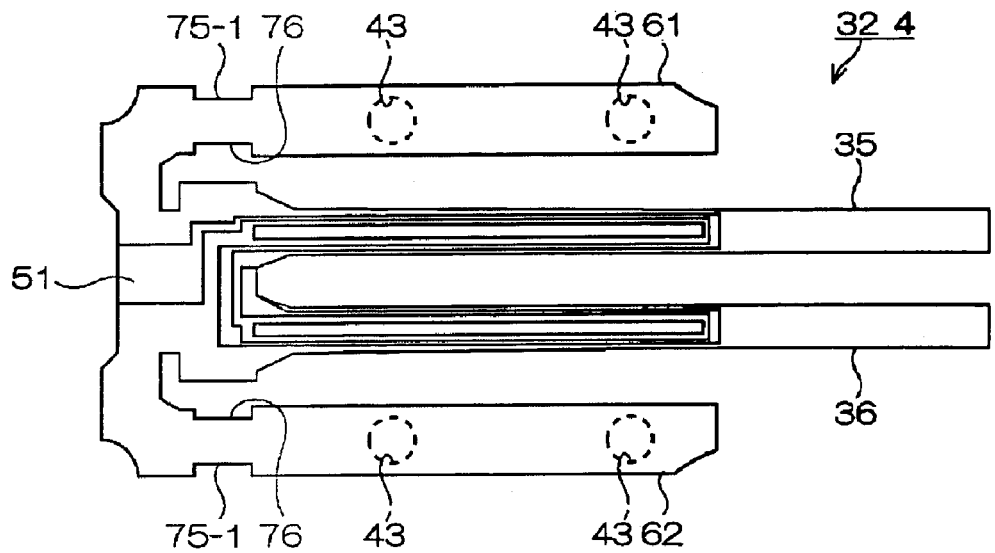
FIG. 13 is a schematic enlarged plan view of the piezoelectric resonator element according to a fifth embodiment.

FIG. 13 is a schematic plan view illustrating the piezoelectric resonator element according to a fifth embodiment of the invention.

As for a piezoelectric resonator element 32-4 of the fifth embodiment, the structure that is common to that of the piezoelectric resonator element 32-3 of the fourth embodiment is given the same numerals. A duplicate explanation of thereof is omitted. Differences will be explained below.

Each of the piezoelectric resonator elements 61 and 62 in FIG. 13 includes bonding positions, which serve as the coating region of the conductive adhesive, indicated as the numeral 43, and cut parts 75-1 and 76, which serve as a structure lowering the stiffness and are on the way to the base 51. The cut parts 75-1 and 76 are the same as those of the third embodiment in FIG. 6 in the viewpoint that they are formed at the outer side edge and the inner side edge in the vicinity of the base end part of each of the supporting arms. Similar to the third embodiment, they show the effect that reliably prevents the flexural vibration of the vibration arms 35 and 36 from being leaked.

However, the embodiment differs from the third embodiment in that the cut parts 75-1 and 76 are formed at the same position in the longitudinal direction of each of the vibration arms 61 and 62.

It goes without saying that the bonding position can be employed as one part for each of the supporting arms 61 and 62 the same as the embodiment in FIG. 1.

Figure 14:
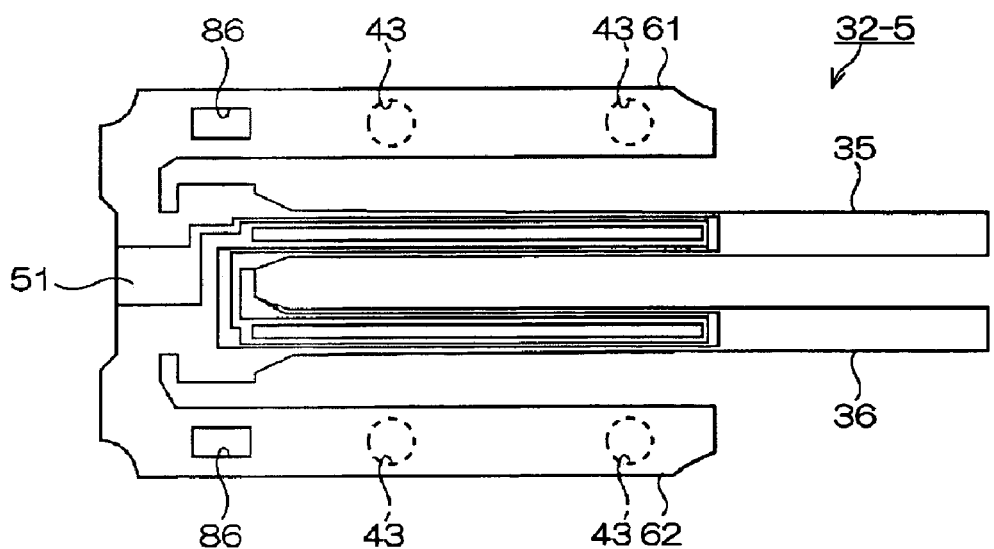
FIG. 14 is a schematic enlarged plan view of the piezoelectric resonator element according to a sixth embodiment.

FIG. 14 is a schematic plan view illustrating the piezoelectric resonator element according to a sixth embodiment of the invention.

As for a piezoelectric resonator element 32-5 of the sixth embodiment, the structure that is common to that of the piezoelectric resonator element 32-3 of the fourth embodiment is given the same numerals. A duplicate explanation of thereof is omitted. Differences will be explained below.

Each of the piezoelectric resonator elements 61 and 62 in FIG. 14 includes bonding positions, each of which serves as the coating region of the conductive adhesive, indicated as the numeral 43, and a through hole 86, which serves as a structure lowering the stiffness and is toward the base 51.

The through hole 86 provided to the supporting arm demonstrates the same effect as that of the cut part in the viewpoint that it can reduce the leakage of the flexural vibration of the vibration arms 35 and 36. In a case where providing the cut part can cause an excessive stiffness drop partially in the supporting arm, providing the through hole 86 causes a smaller stiffness drop, thereby having an advantage in strength.

Similar to the fifth embodiment, it goes without saying that the bonding position can be employed as one part for each of the supporting arms 61 and 62 the same as the embodiment in FIG. 1.

Figure 15:
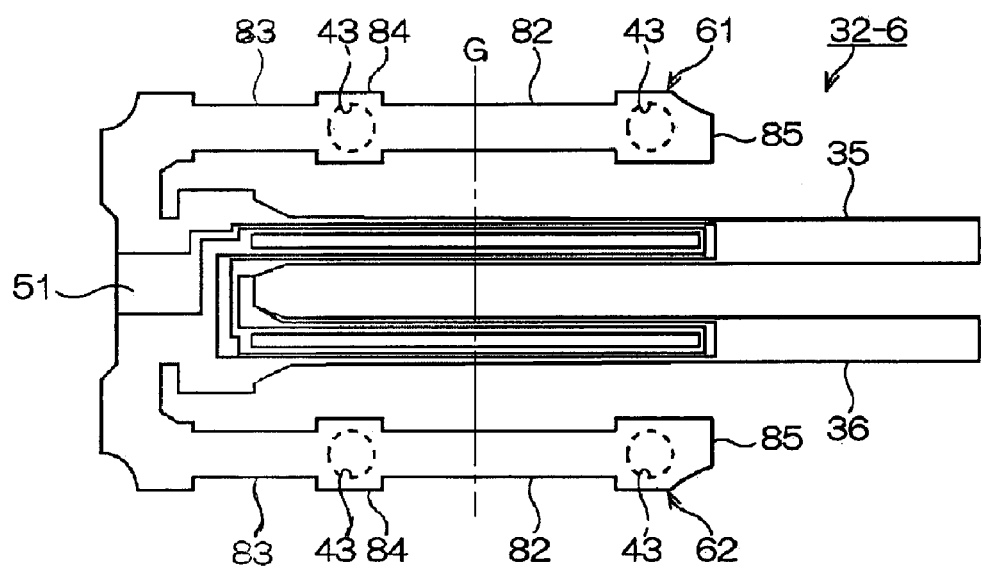
FIG. 15 is a schematic enlarged plan view of the piezoelectric resonator element according to a seventh embodiment.

FIG. 15 is a schematic plan view illustrating the piezoelectric resonator element according to a seventh embodiment of the invention.

As for a piezoelectric resonator element 32-6 of the seventh embodiment, the structure that is common to that of the piezoelectric resonator element 32-3 of the fourth embodiment is given the same numerals. A duplicate explanation of thereof is omitted. Differences will be explained below.

Each of the piezoelectric resonator elements 61 and 62 in FIG. 15 includes bonding positions, which serve as the coating region of the conductive adhesive, indicated as the numeral 43, and slimmed width parts 82 and 83, which serve as a structure lowering the stiffness and are toward the base 51.

Since each of the supporting arms 61 and 62 has the same structure, only the supporting arm 61 will be explained. Specifically, for example, bonding positions 84 and 85, in which the width dimension become larger, are formed at the positions symmetrically spaced apart from the gravity center G of the piezoelectric resonator element 32-6 with the same distance in the supporting arm 61.

The conductive adhesive 43 is applied to each of the bonding positions 84 and 85 as shown in FIG. 15 so as to be bonded to the package.

In the supporting arm 61, the slimmed width parts 82 and 83 are formed by reducing the width dimension in the region excluding the bonding positions 84 and 85 and the base end part of the supporting arm 61.

In the structure described above, the slimmed parts 82 and 83 demonstrate the same effect as that of the cut part in the viewpoint that they can reduce the leakage of the flexural vibration of the vibration arms 35 and 36.

In addition, the region to which the conductive adhesives 43 are applied such as the bonding positions 84 and 85 has an advantage by giving a different shape than other regions. The advantage is to achieve the process using image processing or the like in the bonding process of the piezoelectric resonator element to the package in manufacturing processes described later.

Moreover, the position of the end part, which is adjacent to the base 51, of the long grooves 33 and 34 is preferably the same as the footing part of the vibration arms 35 and 36, i.e., the position T, or is in the range in which the first reduced width part TL is present and slightly spaced apart from the position T toward the distal part of the vibration arm, and, particularly, is not preferably adjacent to the base end of the base 51 from the position T.

Method for Manufacturing a Piezoelectric Device

Figure 12:
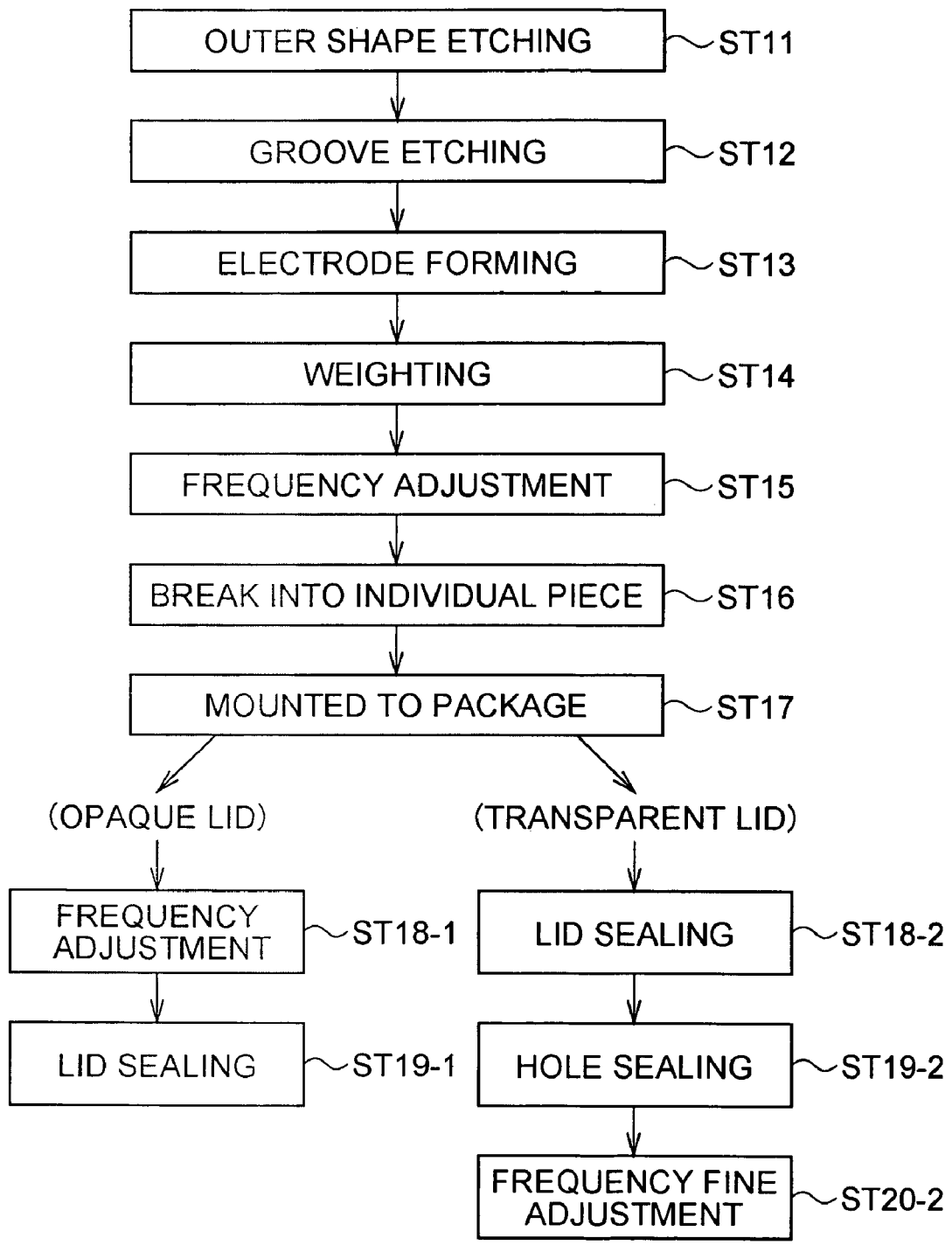
FIG. 12 is a flow chart illustrating one example of a method for manufacturing the piezoelectric device of the invention.

Next, an example of a method for manufacturing the piezoelectric device will be explained referring to a flow chart in FIG. 12. While only the case where the piezoelectric resonator element and piezoelectric device of some of the embodiments are manufactured will be described in the following processes, the processes are common to all of the embodiments described above.

Method for Manufacturing Lid and Package

The piezoelectric resonator element 32, the package 57, and the lid 40 in the piezoelectric device 30 are individually manufactured.

The lid 40 is prepared as a lid having a suitable size for sealing the package 57 by cutting, for example, a glass plate having a given size, for example, a sheet glass of borosilicate glass.

The package 57 is formed, as above described, by laminating a number of substrates made of aluminum-oxide ceramic green sheets and then firing the substrates. In the forming, each of the number of substrates is provided with a given hole inside thereof so as to form a given inner space S inside when they are laminated.

Method for Manufacturing Piezoelectric Resonator Element

First, a piezoelectric substrate is prepared. Then, a given number of piezoelectric resonator elements are simultaneously formed from one piezoelectric substrate by etching their outer shapes (outer shape etching).

Figure 16:
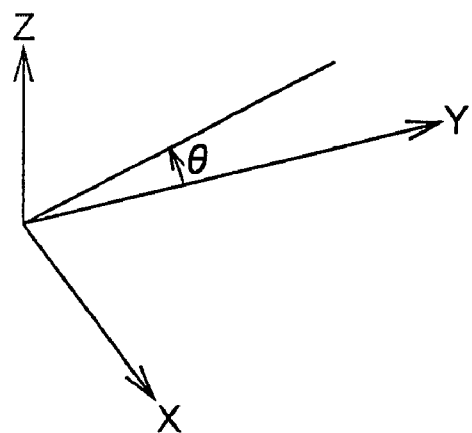
FIG. 16 shows coordinate axes of a quartz Z plate.

Here, for example, a quartz wafer having a size capable for dividing it into several or many of the piezoelectric resonator elements 32 is used from piezoelectric materials as the piezoelectric substrate. The piezoelectric substrate is cut from the piezoelectric material, for example, a single crystal of quartz, so that the X-axis is electrical axis, the Y-axis is mechanical axis, and the Z-axis is optical axis, which are shown in FIGS. 7 or 10, because the piezoelectric substrate forms the piezoelectric resonator element 32-3 in FIG. 9 as the processes proceed. The piezoelectric resonator element 32 in FIG. 1 is also manufactured in the same manner. A quartz Z plate is cut by being rotated within a range of zero (0) to five (5) degrees in clock wise about the Z-axis ($\theta$ in FIG. 16) in the orthogonal coordinate system composed of the X, Y, and Z-axes when cutting it from the single crystal of quartz. Then, the quartz Z plate is cut and polished to a given thickness.

In the outer shape etching, the piezoelectric substrate exposed as the part outside from the outer shape of the piezoelectric resonator element is subjected to the etching of the outer shape of the piezoelectric resonator element by using, for example, a hydrofluoric acid solution as an etchant with a mask such as a corrosion resistant film (not shown). For the corrosion resistant film, for example, a metal film such as gold vapor deposited on chromium as an underlayer, or the like can be used. The etching process varies depending on the concentration, kind, temperature, and so forth of the hydrofluoric acid solution.

Here, the wet etching in the outer shape etching process shows the following anisotropic etching to the mechanical axis X, electrical axis Y, and optical axis Z shown in FIG. 9 as the etching proceeds.

Namely, the etching rate in X-Y plain of the piezoelectric resonator element 32-3 is follows: in the plus X direction, the progression of etching is fast in the plain in the direction of 120 degrees with respect to the X-axis and in the plain in the direction of minus 120 degrees with respect to the X-axis; and, in the minus X direction, the progression of etching is slow in the plain in the direction of 30 degrees with respect to the X-axis and in the plain in the direction of minus 30 degrees with respect to the X-axis.

Likewise, the progression of etching speed in the Y direction is fast in the plus 30 and minus 30 degrees. In the plus Y direction, the progression of etching speed is slow in the plus 120 and minus 120 degrees directions with respect to the Y-axis.

Due to the anisotropy in the etching progression, the irregular shaped part protruding as a fin shape is formed on the outer side of each of vibration arms of the piezoelectric resonator element 32-3 as indicated as the numeral 81 in FIG. 10.

However, in the embodiment, the protruded amount v of the irregular shaped part 81 explained in FIG. 10 can be extremely lessened within 5 μm by etching for sufficient time, i.e. from 9 to 11 hours, using hydrofluoric acid and ammonium fluoride as the etchant (ST11).

In the process, the outer shape of the piezoelectric resonator element 32-3 including the cut parts 71 and 72 is simultaneously formed. When the process is completed, many piezoelectric resonator elements 32-3, each of which is connected to the quartz wafer in the vicinity of the base 51 with a slim connecting part, are achieved as their outer shapes are completed.

Half Etching Process for Forming Groove

Next, with the resist (not shown) for forming a groove, the corrosion resistant film remains at the part to which the groove is not formed so as to leave both wall parts sandwiching each long groove as shown in FIG. 10. Then, the front and back side of each of the vibration arms 35 and 36 are wet etched with the same etching condition of the outer shape etching so as to form the bottom corresponding to the long groove (ST12).

Here, with reference to FIG. 10, the depth of the groove indicated by the symbol t is approximately from 30 to 45% with respect to the entire thickness x. As for t, if it is 30% and below of the entire thickness x, there can be a case where the electric field efficiency cannot sufficiently be improved. If it is 45% and above, there can be a case where the flexural vibration is adversely affected or the strength is insufficient due to the insufficient stiffness.

Here, both or either of the outer shape etching and the groove etching can be performed by dry etching. In this case, for example, a metal mask is disposed in each time on the piezoelectric resonator substrate (quartz wafer) so as to cover the outer shape of the piezoelectric resonator element 32-3, or the region corresponding to the long groove after forming the outer shape. The piezoelectric substrate with the mask is, for example, put into a chamber (not shown), and then an etchant gas is supplied at a given degree of vacuum in the chamber so as to produce etching plasma. As a result, dry etching can be performed. Namely, for example, a freon gas tank and an oxygen gas tank are connected to a vacuum chamber (not shown), and further an exhausting pipe is provided to the vacuum chamber so as to vacuum the chamber at a given degree of vacuum.

When the inside of the vacuum chamber is vacuum exhausted to a given degree of vacuum so that freon gas and oxygen gas are supplied and charged to reach a given pressure of the mixed gas of the two. Then a direct voltage is applied to generate plasma. The mixed gas containing ionized particles hit the piezoelectric material exposed from the metal mask. The bombardment mechanically chips away and scatters the piezoelectric material. As a result, etching proceeds.

Electrode Forming Process

Next, a metal serving as the electrode, for example, gold is deposited on the entire surface by vapor deposition or sputtering, etc. Then, the electrode for driving shown in FIG. 7 is formed by photolithography using the resist exposing the part on which the electrode is not formed (ST13). Subsequently, weighted electrodes (metal films) 21 are formed on the distal part of each of the vibration arms 35 and 36 by sputtering or vapor deposition, or the like (ST14). The weighted electrodes 21 are not used for driving the piezoelectric resonator element 32-3 with applying a voltage, but are utilized for a frequency adjustment will be described later.

Next, frequency is roughly adjusted on the wafer (ST15). The rough adjustment is the frequency adjustment by a mass reducing method in which a part of the weighted electrodes 21 are partially evaporated by irradiating an energy beam such as a laser beam, etc. Subsequently, the slim connecting part connected to the wafer is broken off so as to be an individual piece forming the piezoelectric resonator element 32-3 (ST16).

Then, as described in FIG. 7, the conductive adhesive 43 is applied on each of the electrodes 31-1 and 31-2 of the package 57. On the conductive adhesives 43, the supporting arms 61 and 62 are placed. By heating and curing the adhesives, the piezoelectric resonator element 32-3 is bonded to the package 57 (ST17).

Here, the conductive adhesive 43 is, for example, one that is composed of a binder utilizing synthetic resins or the like, and conductive particles such as silver or the like that are mixed into the binder, and can simultaneously achieve a mechanical connection and an electrical connection.

In a case where the lid 40 is made of an opaque material such as metal or the like, the through hole 27 described in FIG. 8 is not provided. Then, for example, a laser beam is irradiated to the vibration arm 35 and/or the adjacent to the distal part of the weighted electrode 21 of the vibration arm 36 while applying a driving voltage to the piezoelectric resonator element 32-3 and monitoring a frequency so that the frequency adjustment serving as a fine tuning is performed by the mass reducing method (ST18-1).

Subsequently, the lid 40 is bonded to the package 57 by seam welding or the like in vacuum (ST19-1). After required inspections, the piezoelectric device 30 is completed.

Alternatively, in a case where the package 57 is sealed with the lid 40 which is transparent, the lid 40 is bonded to the package 57 after bonding in the step of ST17 of the piezoelectric resonator element 32-3 (ST18-2).

In this case, for example, the heating process is performed in which the lid 40 is bonded to the package 57 by heating a low melting point glass or the like. In this time, gas is produced from the low melting point glass and the conductive adhesive and the like. Accordingly, the gas is exhausted from the through hole 27 described in FIG. 8 by heating (degassing). Then, a metal ball or pellet made of gold tin, more preferably, gold germanium, or the like is disposed to a stepped part 29 in vacuum, being melted by irradiating a laser beam, etc. As a result, the sealing member 28 made of metal in FIG. 8 hermetically seals the through hole 27 (ST19-2).

Then, as shown in FIG. 8, a laser beam is irradiated so as to transmit through the lid 40, which is transparent and made of such as glass or the like, to the vibration arm 35 and/or the adjacent to the distal part of the weighted electrode 21 of the vibration arm 36. As a result, the frequency adjustment serving as a fine-tuning is performed by the mass reducing method (ST20-2). After required inspections, the piezoelectric device 30 is completed.

It should be understood that the invention is not limited to the above-described embodiments. The structure of each embodiment can be accordingly combined or omitted, and an additional structure not shown can also be combined therewith.

In addition, the invention can be applied to not only one in which the piezoelectric resonator element is housed in a box shaped package, but also to one in which the piezoelectric resonator element is housed in a cylindrical package, one in which the piezoelectric resonator element functions as a gyro sensor, and further to any piezoelectric devices utilizing the piezoelectric resonator element regardless of the name of the piezoelectric resonator, piezoelectric oscillator, etc. Moreover, a pair of vibration arms is formed in the piezoelectric resonator element 32. However, the number of vibration arms is not limited to this, but can be three (3) or more.

What is claimed is:

1. A piezoelectric resonator element, comprising:
    a base formed of a piezoelectric material;
    a plurality of vibration arms extending from a first part of the base and including a decreasing width extending from a junction of each vibration arm and the base towards a distal end of each vibration arm;
    a supporting arm extending from a second part of the base spaced apart from the first part of the base by a given length in a width direction, the supporting arm extending along the vibration arms outboard of the vibration arms;
    a long groove formed along a longitudinal direction of each of the vibration arms; and
    an electrode for driving formed in each of the long grooves.

2. The piezoelectric resonator element according to claim 1, wherein each of the resonating arms includes:
    a transition point proximate to the distal end of each vibration arm that defines a first portion of each vibration arm extending between the transition point and the junction of each vibration arm and the base and a second portion extending between the transition point and the distal end, the second portion having one of the same width as the width of the vibration arm at the transition point and a greater width than the width of the vibration arm at the transition point; and
    the transition point being disposed closer to the distal end of each vibration arm than the distal end of the long groove.

3. The piezoelectric resonator element according to claim 1, wherein a ratio of a maximum width of the vibration arm and a minimum width of the vibration arm is greater than 1.06.

4. The piezoelectric resonator element according to claim 1, wherein the reduced width part includes:
    a first reduced width part extending from the base portion; and
    a second reduced width part that decreases the width of each of the vibration arms more gradually than the first reduced width part, the second reduced width part being connected to an end of the first reduced width part.

5. The piezoelectric resonator element according to claim 4, wherein a reduced-width dimension of the vibration arm inside of the first reduced width part is 11 μm or more.

6. The piezoelectric resonator element according to claim 4 further comprising a cut part formed approximately halfway along the supporting arm.

7. A piezoelectric device, comprising:
    a piezoelectric resonator element housed in one of a package and a case, the piezoelectric resonator element including:
    a base formed of a piezoelectric material;
    a plurality of vibration arms extending from a first part of the base;
    a supporting arm extending from a second part of the base spaced apart from the first part of the base by a given length in a width direction, the supporting arm extending along the vibration arms outboard of the vibration arms;
    a long groove formed along a longitudinal direction of each of the vibration arms;
    an electrode for driving formed in the long groove; and
    a reduced width part that decreases the width of each of the vibration arms toward a distal end of the vibration arm.

8. The piezoelectric device according to claim 1, wherein each of the resonating arms includes a transition point proximate to the distal end of each vibration arm that defines a first portion of each vibration arm extending between the transition point and the junction of each vibration arm and the base and a second portion extending between the transition point and the distal end, the second portion having one of the same width as the width of the vibration arm at the transition point and a greater width than the width of the vibration arm at the transition point, the transition point being disposed closer to the distal end of each vibration arm than is the distal end of the long groove.

9. The piezoelectric device according to claim 7, wherein each of the resonating arms includes a transition point proximate to the distal end of each vibration arm that defines a first portion of each vibration arm extending between the transition point and the junction of each vibration arm and the base and a second portion extending between the transition point and the distal end, the second portion having one of the same width as the width of the vibration arm at the transition point and a greater width than the width of the vibration arm at the transition point, the transition point being disposed between the distal end of each vibration arm and the distal end of the long groove.

10. The piezoelectric device according to claim 7, wherein a ratio of a maximum width of the vibration arm and a minimum width of the vibration arm is greater than 1.06.

11. The piezoelectric device according to claim 7, wherein the reduced width part includes:
- a first reduced width part extending from the base; and
- a second reduced width part that decreases the width of each of the vibration arms more gradually than the first reduced width part, the second reduced width part being connected to an end of the first reduced width part.

12. A piezoelectric resonator element, comprising:
- a base formed of a piezoelectric material;
- a plurality of vibration arms extending from a first part of the base;
- a supporting arm extending from a second part of the base spaced apart from the first part of the base by a given length in a width direction, the supporting arm extending along the vibration arms outboard of the vibration arms and bonded to a package with a conductive adhesive;
- a long groove formed along a longitudinal direction of each of the vibration arms;
- an electrode for driving formed in the long groove; and
- a through hole formed in one of the supporting arm.

13. A piezoelectric resonator element, comprising:
- a base formed of a piezoelectric material;
- a plurality of vibration arms extending from a first part of the base;
- a supporting arm extending from a second part of the base spaced apart from the first part of the base by a given length in a width direction, the supporting arm extending along the vibration arms outboard of the vibration arms and bonded to a package with a conductive adhesive;
- a long groove formed along a longitudinal direction of each of the vibration arms;
- an electrode for driving formed in the long groove; and
- a cut part formed in a portion of the base by reducing a width of the piezoelectric material in a width direction of the base, the cut portion being closer to the vibration arms than a connecting part at which the supporting arm is connected to the base;
- wherein distance from a footing part of the vibration arm to the cut part exceeds a width of the distal end of the vibration arm.

14. The piezoelectric resonator element according to claim 2, wherein each first portion of each vibration arm includes:
- a first width tapered part extending from the junction of each vibration arm and the base; and
- a second width tapered part extending from a distal end of the first width tapered part, the second width tapered part having a taper rate which is less than that of the first width tapered part.

15. The piezoelectric resonator element according to claim 4, wherein each of the reduced width parts includes the long groove.

* * * * *

UNITED STATES PATENT AND TRADEMARK OFFICE
CERTIFICATE OF CORRECTION

PATENT NO.          : 7,521,846 B2                                          Page 1 of 1
APPLICATION NO. : 11/252317
DATED                   : April 21, 2009
INVENTOR(S)         : Hideo Tanaya It is certified that error appears in the above-identified patent and that said Letters Patent is hereby corrected as shown below:

| | |
|---|---|
| Title Page, Item (*) Notice:, Line 4 | Insert --This patent is subject to a terminal disclaimer.-- |
| Col. 5, Line 65 | "cuts" should be --cut-- |
| Col. 10, Line 12 | "khz" should be --kHz-- |
| Col. 10, Line 13 | "khz)." should be --kHz).-- |
| Col. 10, Line 16 | "khz." should be --kHz.-- |
| Col. 12, Line 22 | "Cl" should be --CI-- |
| Col. 13, Line 31 | after "explanation" delete "of" |
| Col. 13, Line 58 | after "explanation" delete "of" |
| Col. 14, Line 17 | after "explanation" delete "of" |
| Col. 15, Line 33 | "clock wise" should be --clockwise-- |
| Col. 15, Line 52 | "plain" should be --plane-- |
| Col. 15, Line 54 | "plain" should be --plane-- |
| Col. 15, Line 55 | "plain" should be --plane-- |
| Col. 15, Line 58 | "plain" should be --plane-- |
| Col. 15, Line 59 | "plain" should be --plane-- |
| Col. 17, Line 23 | after "and/or" delete "the", second occurrence |
| Col. 17, Line 49 | after "and/or" delete "the", third occurrence |
| Col. 18, Line 25 | "hav ing" should be --having-- |
| Col. 20, Line 6 | after "in" delete "one of" |

Signed and Sealed this

Twenty-seventh Day of October, 2009

David J. Kappos
*Director of the United States Patent and Trademark Office*

UNITED STATES PATENT AND TRADEMARK OFFICE
CERTIFICATE OF CORRECTION

PATENT NO. : 7,521,846 B2
APPLICATION NO. : 11/252317
DATED : April 21, 2009
INVENTOR(S) : Hideo Tanaya It is certified that error appears in the above-identified patent and that said Letters Patent is hereby corrected as shown below:

Col. 18, Line 19     "resonating arms" should be --vibration arms--
Col. 18, Line 67     "resonating arms" should be --vibration arms--
Col. 19, Line 12     "resonating arms" should be --vibration arms--

Signed and Sealed this
Twenty-sixth Day of March, 2013

Teresa Stanek Rea
*Acting Director of the United States Patent and Trademark Office*